US011487612B2

(12) United States Patent
Singidi et al.

(10) Patent No.: US 11,487,612 B2
(45) Date of Patent: *Nov. 1, 2022

(54) MULTIPLE MEMORY DEVICES HAVING PARITY PROTECTION

(71) Applicant: Micron Technology, Inc., Boise, ID (US)

(72) Inventors: Harish Reddy Singidi, Fremont, CA (US); Xiangang Luo, Fremont, CA (US); Preston Allen Thomson, Boise, ID (US); Michael G. McNeeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/017,240

(22) Filed: Sep. 10, 2020

(65) Prior Publication Data

US 2020/0409789 A1 Dec. 31, 2020

Related U.S. Application Data

(63) Continuation of application No. 16/155,573, filed on Oct. 9, 2018, now Pat. No. 10,789,126.

(51) Int. Cl.
| | | |
|---|---|---|
| *G06F 11/10* | (2006.01) | |
| *G11C 29/52* | (2006.01) | |
| *G06F 3/06* | (2006.01) | |

(52) U.S. Cl.
CPC .......... *G06F 11/1068* (2013.01); *G06F 3/064* (2013.01); *G06F 3/0619* (2013.01);
(Continued)

(58) Field of Classification Search
CPC ...... G06F 3/0619; G06F 3/064; G06F 3/0644; G06F 3/0656; G06F 3/0659;
(Continued)

(56) References Cited

U.S. PATENT DOCUMENTS

| | | |
|---|---|---|
| 10,789,126 B2 | 9/2020 | Singidi et al. |
| 2013/0055012 A1 | 2/2013 | Roh |

(Continued)

FOREIGN PATENT DOCUMENTS

| | | |
|---|---|---|
| CN | 101644995 A | 2/2010 |
| CN | 102760087 | 10/2012 |

(Continued)

OTHER PUBLICATIONS

U.S. Appl. No. 16/155,573, filed Oct. 9, 2018, Multiple Memory Devices Having Parity Protection.

(Continued)

*Primary Examiner* — Guerrier Merant
(74) *Attorney, Agent, or Firm* — Schwegman Lundberg & Woessner, P.A.

(57) ABSTRACT

A variety of applications can include apparatus and/or methods that provide parity protection to data spread over multiple memory devices of a memory system. Parity is stored in a buffer, where the parity is generated from portions of data written to a page having a different portion of the page in a portion of each plane of one or more planes of the multiple memory devices. Parity is stored in the buffer for each page. In response to a determination that a transfer criterion is satisfied, the parity data in the buffer is transferred from the buffer to a temporary block. After programming data into the block to close the block, a verification of the block with respect to data errors is conducted. In response to passing the verification, the temporary block can be released for use in a next data write operation. Additional apparatus, systems, and methods are disclosed.

20 Claims, 8 Drawing Sheets

(52) U.S. Cl.
CPC .......... *G06F 3/0644* (2013.01); *G06F 3/0656* (2013.01); *G06F 3/0659* (2013.01); *G06F 3/0679* (2013.01); *G11C 29/52* (2013.01)

(58) Field of Classification Search
CPC ............... G06F 3/0679; G06F 12/0246; G06F 11/1072; G06F 2212/7209; G06F 11/1068; G06F 11/1076; G11C 29/52; G11C 29/42; G11C 16/10; G11C 16/08; G11C 16/0483; G11C 7/1006; G11C 2211/5641; G11C 11/5628; G11C 11/5642; G11C 11/5621; G11C 16/26
See application file for complete search history.

(56) References Cited

U.S. PATENT DOCUMENTS

| | | |
|---|---|---|
| 2013/0132652 A1 | 5/2013 | Wood et al. |
| 2013/0246891 A1 | 9/2013 | Manning et al. |
| 2013/0290777 A1 | 10/2013 | Yoshihara |
| 2014/0245097 A1 | 8/2014 | Larsen et al. |
| 2015/0262712 A1 | 9/2015 | Chen et al. |
| 2015/0309744 A1 | 10/2015 | Takeuchi et al. |
| 2016/0364294 A1 | 12/2016 | Amato et al. |
| 2017/0249211 A1 | 8/2017 | Hoei et al. |
| 2017/0315909 A1 | 11/2017 | Yang et al. |
| 2018/0024897 A1 | 1/2018 | Cai et al. |
| 2018/0260322 A1 | 9/2018 | Yang et al. |
| 2018/0285195 A1 | 10/2018 | Yang et al. |
| 2019/0114225 A1 | 4/2019 | Gopalakrishnan |
| 2020/0110661 A1 | 4/2020 | Singidi et al. |

FOREIGN PATENT DOCUMENTS

| | | |
|---|---|---|
| CN | 102890621 | 1/2013 |
| CN | 113168358 | 7/2021 |
| WO | WO-2012081733 A1 | 6/2012 |
| WO | WO-2020076582 A1 | 4/2020 |

OTHER PUBLICATIONS

"International Application Serial No. PCT US2019 054260, International Preliminary Report on Patentability dated Apr. 22, 2021", 7 pgs.

"International Application Serial No. PCT/US2019/054260, International Search Report dated Jan. 21, 2020", 3 pgs.

"International Application Serial No. PCT/US2019/054260, Written Opinion dated Jan. 21, 2020", 5 pgs.

"Chinese Application Serial No. 201980075676.8, Office Action dated Dec. 29, 2021", w English translation, 21 pgs.

"European Application Serial No. 19870431.4, Extended European Search Report dated May 27, 2022", 10 pgs.

"Chinese Application Serial No. 201980075676.8, Response filed May 12, 2022 to Office Action dated Dec. 29, 2021", w English Claims, 24 pgs.

"European Application Serial No. 19870431.4, Response Filed Nov. 29, 2021 to Communication Pursuant to Rules 161(2) and 162 EPC dated May 19, 2021", 11 pgs.

717

| SUPER PAGE <n> | DATA PARITY |
|---|---|
| 0 | P0 |
| 1 | P1 |
| 2 | P2 |
| 3 | P3 |
| 4 | P4 |
| 5 | P5 |
| 6 | P6 |
| 7 | P7 |

716 — HOST SUPER BLOCK

| SUPER PAGE <n> | LUN1 PLANE 0 | LUN1 PLANE 1 | LUN1 PLANE 2 | LUN1 PLANE 3 | LUN2 PLANE 0 | LUN2 PLANE 1 | LUN2 PLANE 2 | LUN2 PLANE 3 |
|---|---|---|---|---|---|---|---|---|
| 0 | D0 | D0 | D0 | D0 | D0 | D0 | D0 | D0 |
| 1 | D1 | D1 | D1 | D1 | D1 | D1 | D1 | D1 |
| 2 | D2 | D2 | D2 | D2 | D2 | D2 | D2 | D2 |
| 3 | D3 | D3 | D3 | D3 | D3 | D3 | D3 | D3 |
| 4 | D4 | D4 | D4 | D4 | D4 | D4 | D4 | D4 |
| 5 | D5 | D5 | D5 | D5 | D5 | D5 | D5 | D5 |
| 6 | D6 | D6 | D6 | D6 | D6 | D6 | D6 | D6 |
| 7 | D7 | D7 | D7 | D7 | D7 | D7 | D7 | D7 |
| ... | | | | | | | | |

718 — TEMPORARY PARITY SUPER BLOCK

| SUPER PAGE <n> | LUN1 PLANE 0 | LUN1 PLANE 1 | LUN1 PLANE 2 | LUN1 PLANE 3 | LUN2 PLANE 0 | LUN2 PLANE 1 | LUN2 PLANE 2 | LUN2 PLANE 3 |
|---|---|---|---|---|---|---|---|---|
| 0 | P0 | P1 | P2 | P3 | P4 | P5 | P6 | P7 |
| 1 | | | | | | | | |
| 2 | | | | | | | | |
| ... | | | | | | | | |
| ... | | | | | | | | |
| ... | | | | | | | | |

FIG. 7

MULTIPLE MEMORY DEVICES HAVING PARITY PROTECTION

PRIORITY APPLICATION

This application is a continuation of U.S. application Ser. No. 16/155,573, filed Oct. 9, 2018, which is incorporated herein by reference in its entirety.

BACKGROUND

Memory devices are typically provided as internal, semiconductor, integrated circuits in computers or other electronic devices. There are many different types of memory, including volatile and non-volatile memory. Volatile memory requires power to maintain its data, and examples of volatile memory include random-access memory (RAM), dynamic random-access memory (DRAM), and synchronous dynamic random-access memory (SDRAM), among others.

Non-volatile memory can retain stored data when not powered, and examples of non-volatile memory include flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), and three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include negative-and (NAND) and negative-or (NOR) architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the memory cells in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series-coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context to can refer to any memory cell that can store more than one bit of data per cell (i.e., that can represent more than two programmed states).

Traditional memory arrays are two-dimensional (2D) structures arranged on a surface of a semiconductor substrate and can be referred to as a planar memory array. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples, the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. A SSD can be used as, among other things, the main storage device of a computer, having benefits over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells, to obviate internal battery supply requirements, thus allowing the drive to be more versatile and compact.

A SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

An SSD has the potential for failure and data loss. A method for protecting data in an SSD has included adding levels of error correction code (ECC) to pages and then recovering data using the ECC. A protection scheme beyond ECC has included utilizing approaches at the device level with the use of multiple memory devices, providing redundant array of independent NAND (RAIN) protection. Versions of SSD data protection technology in these approaches have varied.

Some SSD controllers use parallelism in order to increase SSD performance and locate stored data across a set of flash devices, which may be realized as many relatively smaller flash devices to attain a large capacity associated with other storage devices. This parallelism in SSDs spreads spread across multiple of the flash devices of the set. This can be referred to striped data without parity. RAIN technology adds user data protection that extends beyond ECC, minimally impacts drive performance, and can optimize NAND management. With a high degree of parallelism already in place within the SSD by striping, adding a parity protection architecture adds another layer of protection.

A number of the pages of memory cells in a memory array can store a parity portion of a RAIN stripe. For instance, each respective one of the number of pages can include a parity portion of a different RAIN stripe. RAIN is an umbrella term for data storage schemes that divide and/or replicate data among multiple pages of multiple memory devices, for instance, in order to help protect the data stored in the memory devices. The multiple memory devices in a RAIN array may appear to a user and an operating system of a computing machine as a single memory device. RAIN can include striping (e.g., splitting) data so that different portions of the data are stored on different pages of different memory devices. The portions of the different memory devices that store the split data are collectively referred to as a stripe. RAIN can also include mirroring, which can include storing duplicate copies of data on more than one page of more than one device. Since a RAIN stripe can be a combination of user data, other data, and parity data, the parity data can reduce the capacity of the SSD to store user data and can affect the performance of the SSD.

BRIEF DESCRIPTION OF THE DRAWINGS

The drawings, which are not necessarily drawn to scale, illustrate generally, by way of example, but not by way of limitation, various embodiments discussed in the present document.

FIG. 7 is an illustration of an example operation of a parity protection scheme in an arrangement of blocks of memory in multiple memory devices, according to various embodiments.

DETAILED DESCRIPTION

Figure 1:
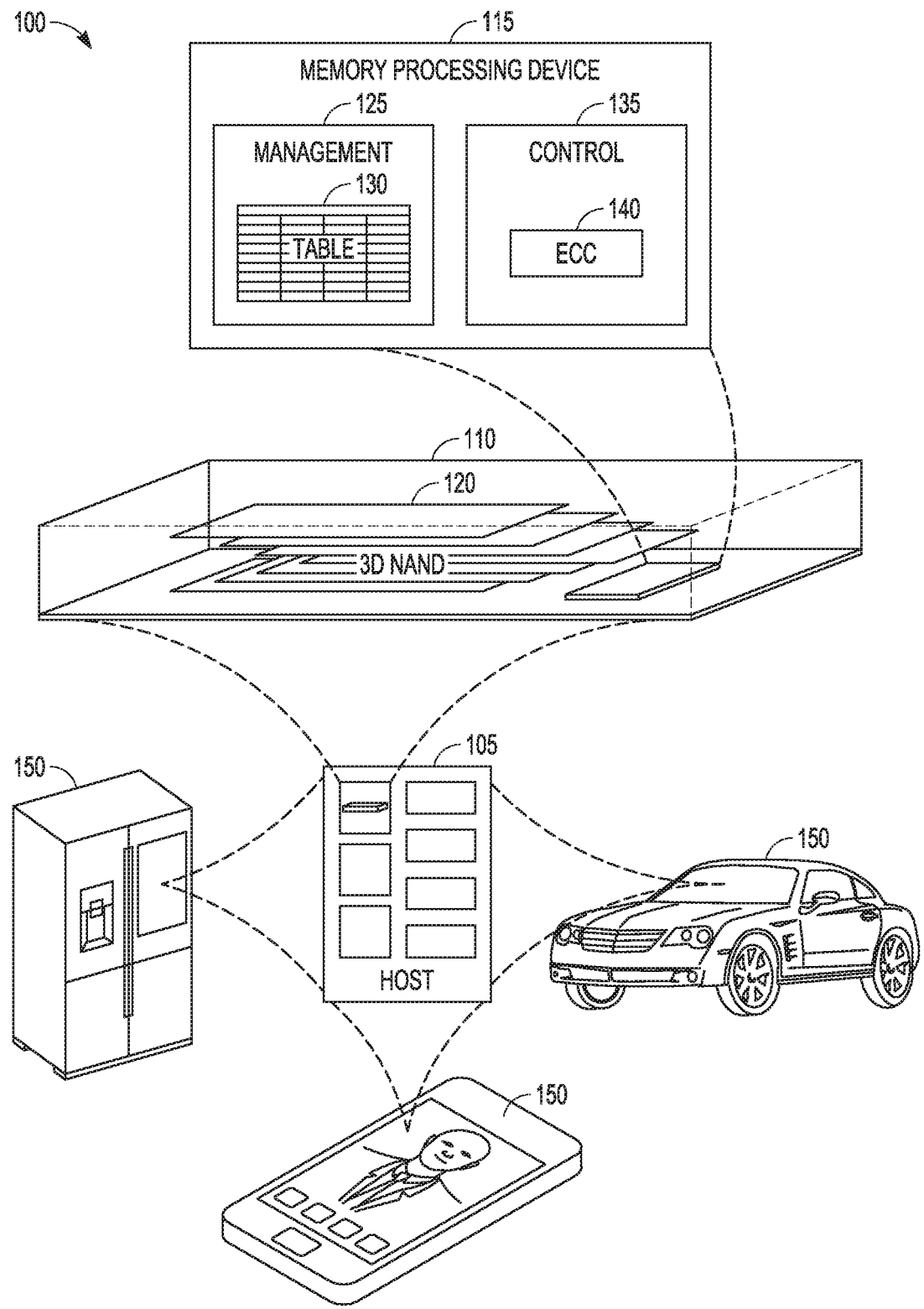
FIG. 1 illustrates an example of an environment including a memory device, according to various embodiments.

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, a temporary block can be used as a place holder for RAIN parity data, that is, to store RAIN parity generated from data programmed to a block of memory, until the block is closed and verified to be free of defects. If a scan of the block, in which data is programmed, doesn't yield any uncorrectable error-correcting code (UECC) errors or a count of correctable ECC errors (CECC) that exceeds a CECC threshold, then the temporary block can be released from operating as a temporary parity block. The temporary block can be operationally structured in the same manner as blocks in which a data is being stored.

In a RAIN scheme that includes blocks to store data and a RAM to store parity data, providing plane level defect protection using the RAIN scheme may use a large amount of RAM space and may also make a significant hit on operational performance. For low density drives, the impact of this Rain scheme on performance may be significant. Dumping the RAIN parity to a temporary block, such as one or more NAND blocks, can reduce high RAM space usage. Whenever RAIN parity size exceeds available RAM buffer size for parity, the parity data can be dumped to the temporary block.

A conventional RAIN scheme retains parity over the lifetime of the stored data, which impacts over provisioning as the system must keep this parity data at the expense of storage space. The system using a conventional RAIN scheme can also experience lost performance due to program and read overhead. Schemes that use a block as a temporary block for storing priority data or similar schemes, as taught herein, can greatly reduce the amount of overprovisioning by only retaining parity data until a block is closed and verified to be free of defects. Due to the fact that the parity is only stored temporarily, the system can deploy a robust scheme, while reducing the quantity of data needed for user data protection. These characteristics of the new scheme can both decrease the negative impact on performance and data overhead associated with previous parity protection approaches, while maintaining the reliability improvement that a robust data parity scheme provides.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory processing device 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host device 105 may be a machine having some portion, or all, of the components discussed in reference to the machine 500 of FIG. 5.

The memory processing device 115 can receive instructions from the host device 105, and can communicate with the memory array, such as to transfer data to (e.g., write or erase) or from (e.g., read) one or more of the memory cells, planes, sub-blocks, blocks, or pages of the memory array.

The memory processing device 115 can include, among other things, circuitry or firmware, including one or more components or integrated circuits. For example, the memory processing device 115 can include one or more memory control units, circuits, or components configured to control access across the memory array 120 and to provide a translation layer between the host device 105 and the memory device 110. The memory processing device 115 can include one or more input/output (I/O) circuits, lines, or interfaces to transfer data to or from the memory array 120. The memory processing device 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory processing device 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory processing device 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory processing device 115. The memory operations can be based on, for example, host commands received from the host device 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory processing device 115. The memory processing device 115 can be configured to actively detect and recover from error occurrences (e.g., bit errors, operation errors, etc.) associated with various operations or storage of data, while maintaining integrity of the data transferred between the host device 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16.384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16.384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page; whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
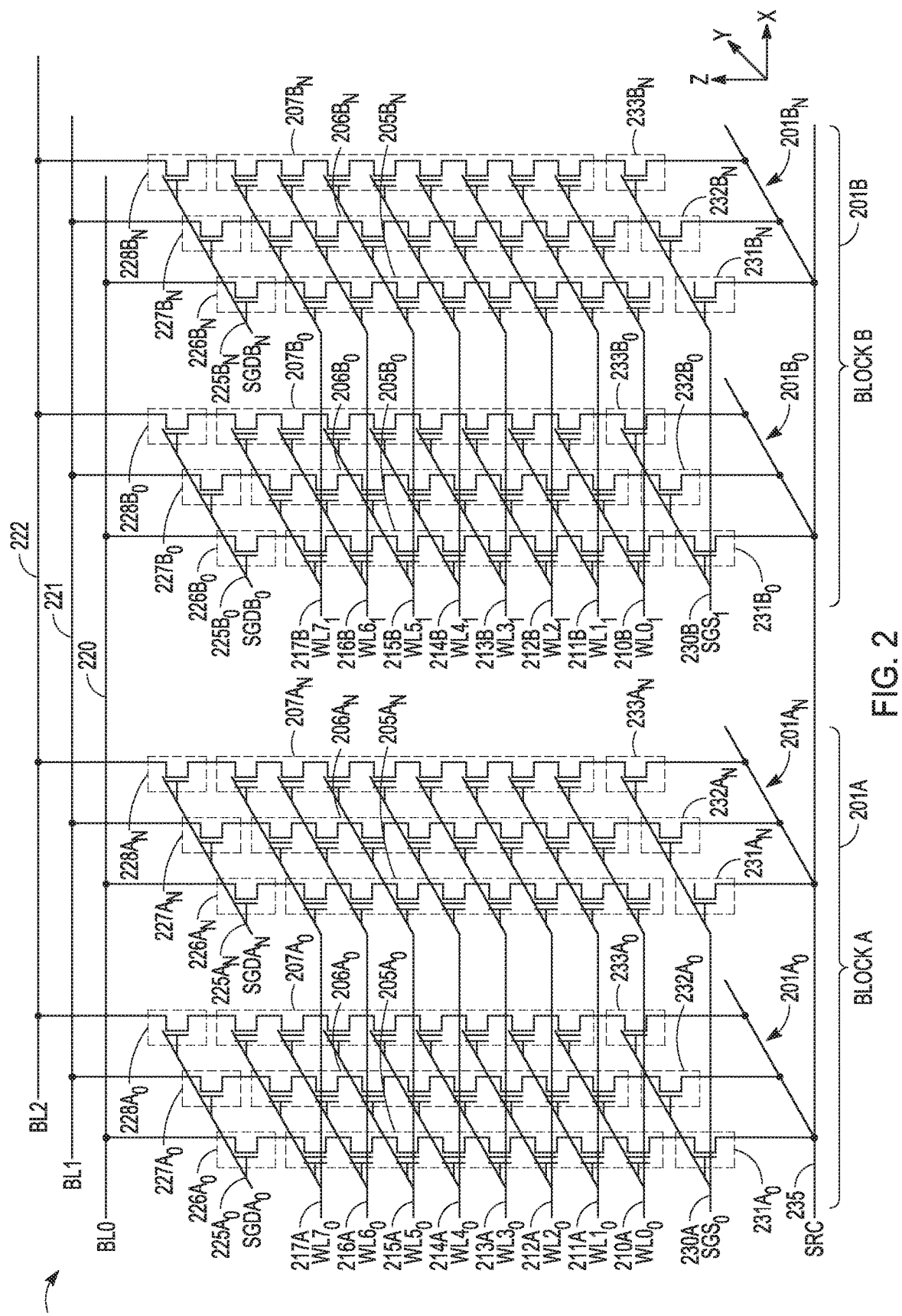
FIGS. 2 and 3 illustrate schematic diagrams of an example of a three-dimensional NAND architecture semiconductor memory array, according to various embodiments.

FIG. 2 illustrates an example schematic diagram of a 3D NAND architecture semiconductor memory array 200 including a number of strings of memory cells (e.g., first-third $A_0$ memory strings 205$A_0$-207$A_0$, first-third $A_n$ memory strings 205$A_n$-207$A_n$, first-third $B_0$ memory strings 205$B_0$-207$B_0$, first-third $B_n$ memory strings 205$B_n$-207$B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS 231$A_0$-233$A_0$, first-third $A_n$ SGS 231$A_n$-233$A_n$, first-third $B_0$ SGS 231$B_0$-233$B_0$, first-third $B_n$ SGS 231$B_n$-233$B_n$, etc.) and a drain-side select gate (SGD) (e.g., first-third $A_0$ SGD 226$A_0$-228$A_0$, first-third $A_n$ SGD 226$A_n$-228$A_n$, first-third $B_0$ SGD 226$B_0$-228$B_0$, first-third $B_n$ SGD 226$B_n$-228$B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 226$A_0$-228$A_0$ can be accessed using an $A_0$ SGD line $SGDA_0$ 225$A_0$, first-third $A_n$ SGD 226$A_n$-228$A_n$ can be accessed using an $A_n$ SGD line $SGDA_n$ 225$A_n$, first-third $B_0$ SGD 226$B_0$-228$B_0$ can be accessed using an $B_0$ SGD line $SGDB_0$ 225$B_0$, and first-third $B_n$ SGD 226$B_n$-228$B_n$ can be accessed using an $B_n$ SGD line $SGDB_n$ 225$B_n$. First-third $A_0$ SGS 231$A_0$-233$A_0$ and first-third $A_n$ SGS 231$A_n$-233$A_n$ can be accessed using a gate select line $SGS_0$ 230A, and first-third $B_0$ SGS 231$B_0$-233$B_0$ and first-third $B_n$ SGS 231$B_n$-233$B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
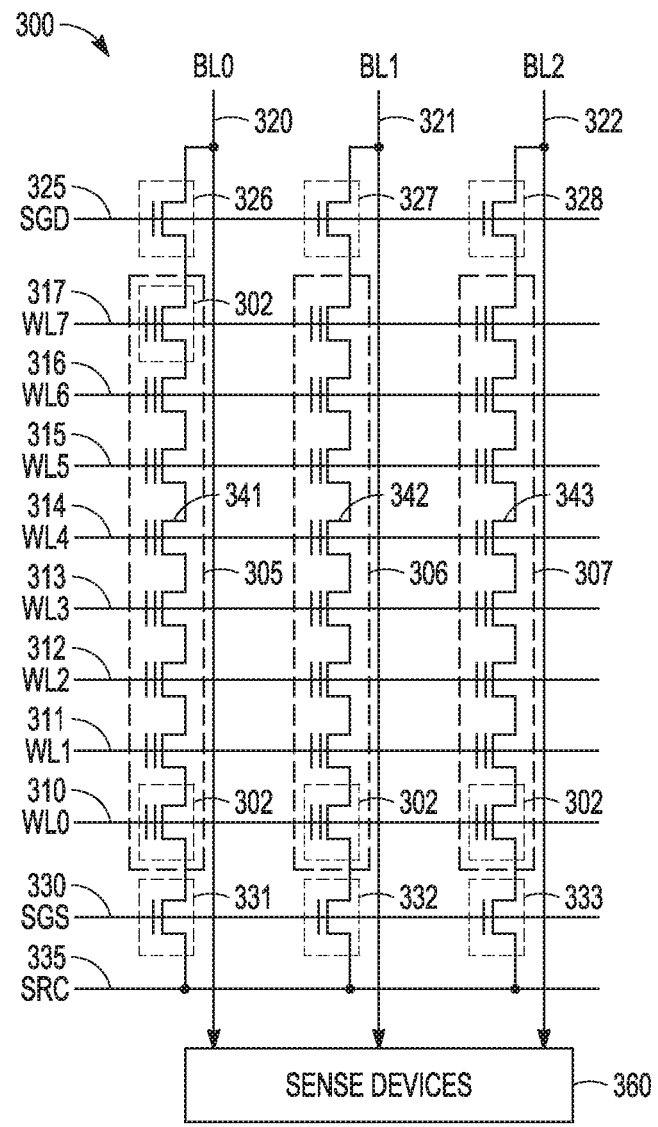

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
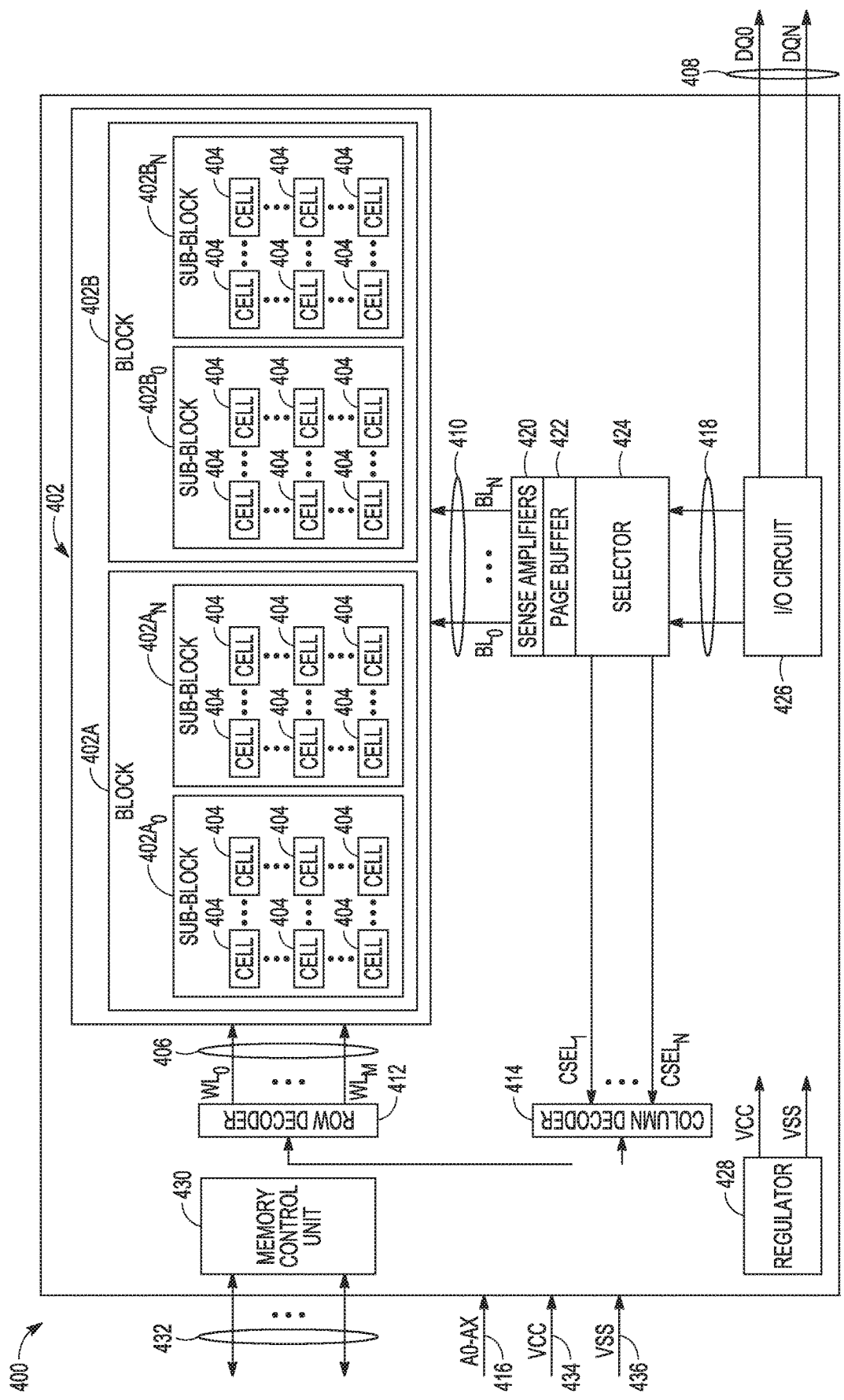
FIG. 4 illustrates an example block diagram of a memory module, according to various embodiments.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
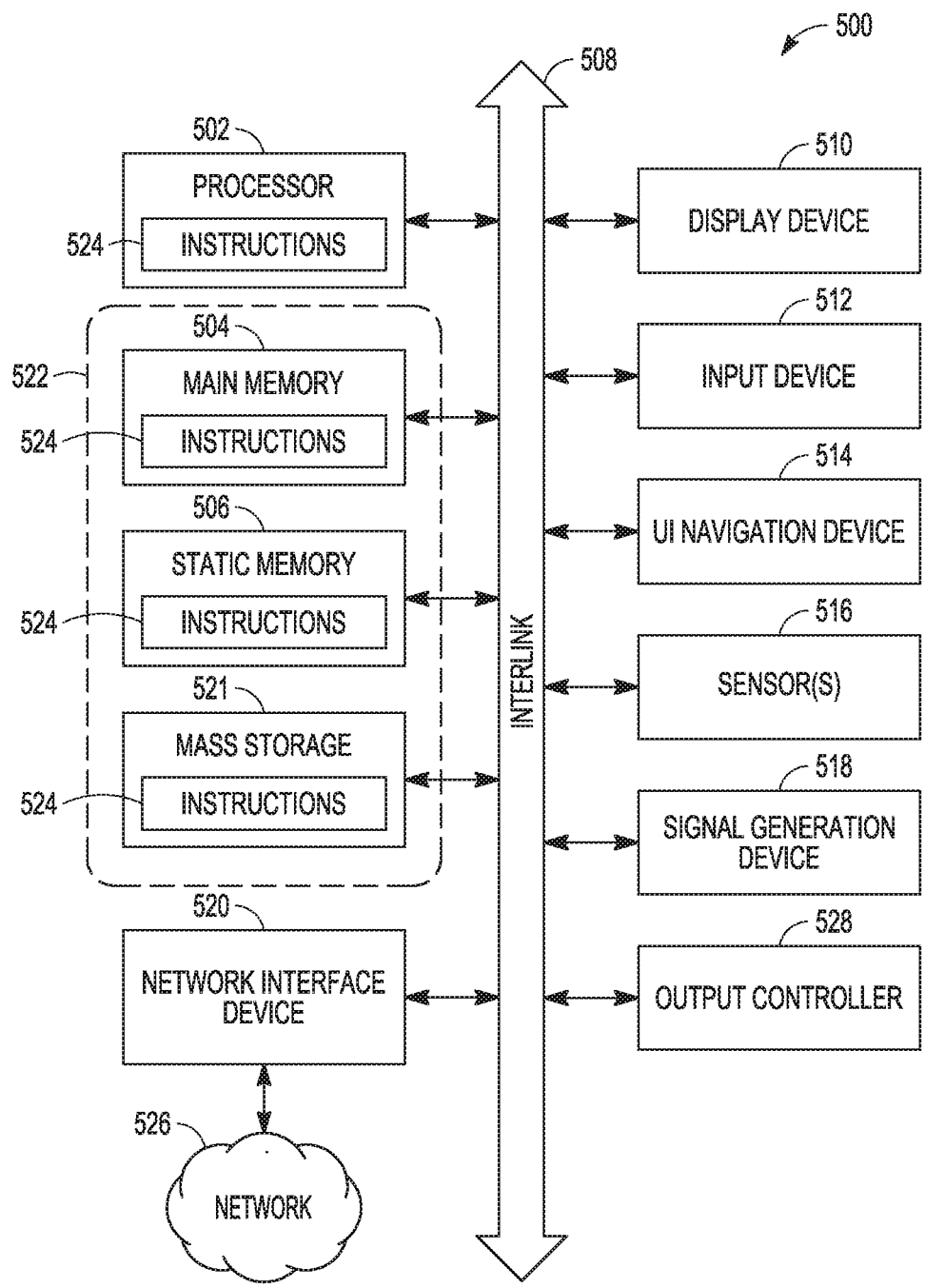
FIG. 5 is a block diagram illustrating an example of a machine upon which one or more embodiments may be implemented, according to various embodiments.

FIG. 5 illustrates a block diagram of an example machine 500 upon which any one or more of the techniques (e.g., methodologies) discussed herein may perform. In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 500 (e.g., the host device 105, the memory device 110, etc.) may include a hardware processor 502 (e.g., a central processing unit (CPU), a graphics processing unit (GPU), a hardware processor core, or any combination thereof, such as the memory processing device 115, etc.), a main memory 504 and a static memory 506, some or all of which may communicate with each other via an interlink (e.g., bus) 508. The machine 500 may further include a display unit 510, an alphanumeric input device 512 (e.g., a keyboard), and a user interface (UI) navigation device 514 (e.g., a mouse). In an example, the display unit 510, input device 512 and UI navigation device 514 may be a touch screen display. The machine 500 may additionally include a storage device (e.g., drive unit) 521, a signal generation device 518 (e.g., a speaker), a network interface device 520, and one or more sensors 516, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 521 may include a machine readable medium 522 on which is stored one or more sets of data structures or instructions 524 (e.g., software) embodying or utilized by any one or more of the techniques or functions described herein. The instructions 524 may also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 521 may constitute the machine readable medium 522.

While the machine readable medium 522 is illustrated as a single medium, the term "machine readable medium" may include a single medium or multiple media (e.g., a centralized or distributed database, or associated caches and servers) configured to store the one or more instructions 524.

The term "machine readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM). Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data are stored on the storage device 521, can be accessed by the memory 504 for use by the processor 502. The memory 504 (e.g., DRAM) is typically fast, but volatile, and thus a different type of storage than the storage device 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the storage device 521 can be allocated to supplement the memory 504; however, because the storage 521 device is typically slower than the memory 504, and write speeds are typically at least twice as slow as read speeds, use of virtual memory can greatly reduce user experience due to storage device latency (in contrast to the memory 504. e.g., DRAM). Further, use of the storage device 521 for virtual memory can greatly reduce the usable lifespan of the storage device 521.

In contrast to virtual memory, virtual memory compression (e.g., the Linux® kernel feature "ZRAM") uses part of the memory as compressed block storage to avoid paging to the storage device 521. Paging takes place in the compressed block until it is necessary to write such data to the storage device 521. Virtual memory compression increases the usable size of memory 504, while reducing wear on the storage device 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 may further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software.

Figure 6:
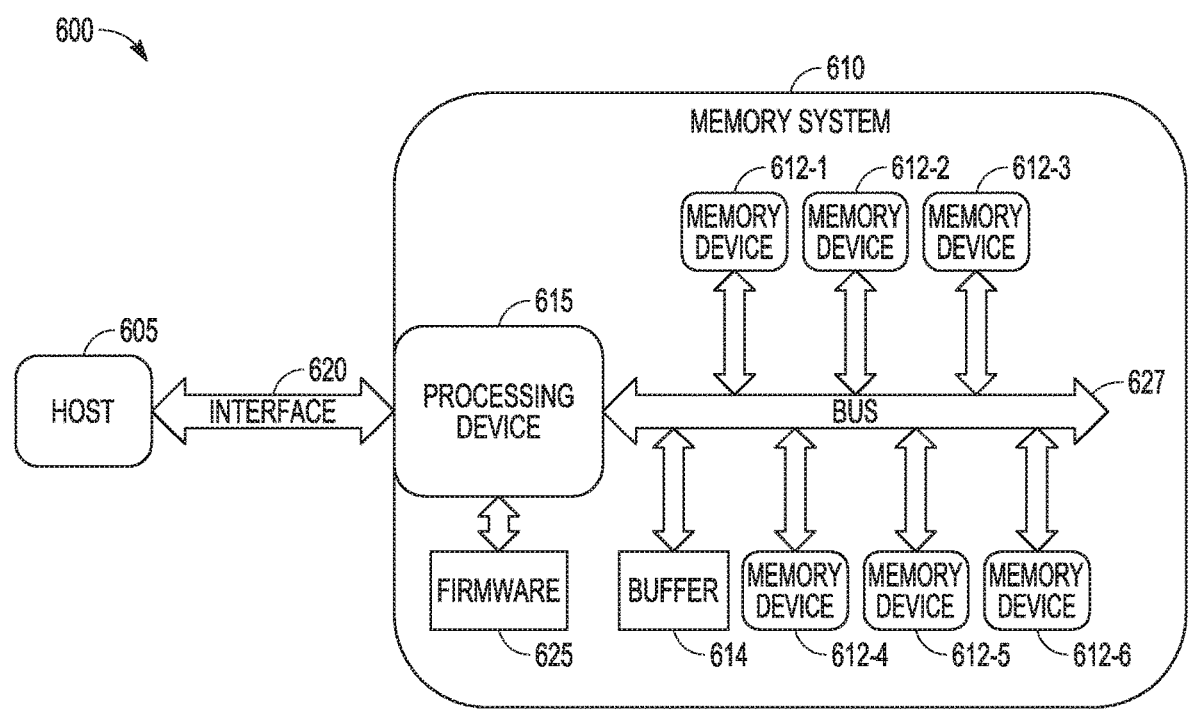
FIG. 6 is a block diagram of an example system including a host that operates with a memory system having multiple memory devices with parity protection, according to various embodiments.

FIG. 6 is a block diagram of an embodiment of example system including a host 605 that operates with a memory system 610 having multiple memory devices with parity protection. The host 605 is coupled to the memory system 610 by an interface 620. The memory system 610 can include a processing device 615 coupled to memory devices 612-1, 612-2, 612-3, 612-4, 612-5, and 612-6 by a bus 627. The memory devices 612-1, 612-2, 612-3, 612-4, 612-5, and 612-6 may be NAND memory devices. Though six memory devices are shown in FIG. 6, the memory system 610 can be implemented with less or more than six memory devices, that is memory system 610 can comprise one or more memory devices. The memory devices can be realized in a number of formats including but not limited to a plurality of memory dies. The processing device 615 can include or be structured as one or more processors.

The memory system 600 can comprise firmware 625 having code executable by the processing device 615 to at least manage the memory devices 612-1, 612-2, 612-3, 612-4, 612-5, and 612-6. The firmware 625 can reside in a storage device of the memory system 610 coupled to the processing device 615. The firmware 625 can be coupled to the processing device 615 using the bus 627 or some other interface on the memory system 610. Alternatively, the firmware 625 can reside in the processing device 615 or can be distributed in the memory system 610 with firmware components, such as but not limited to code, including one or more components in the processing device 615. The firmware 625 can include code having instructions, executable by the processing device 615, to operate on the memory devices 612-1, 612-2, 612-3, 612-4, 612-5, and 612-6. The instructions can include instructions to execute parity protection for data programmed into multiple memory devices of the memory system 610, as taught herein, where a buffer 614 is used to handle parity data. The parity scheme can be implemented as a RAIN scheme. The system 600 and its components can be structured in a number of different arrangements. For example, the system 600 can be arranged with a variation of the type of components that comprise the host 605, the interface 620, the memory system 610, the memory devices 612-1, 612-2, 612-3, 612-4, 612-5, and 612-6, the processing device 615, and the bus 629. The host 605 can comprise one or more processors, which can vary in type. The interface 620 can be arranged as, but not limited to, a peripheral component interconnect express (PCIe) interface. The memory system 610 can be, but is not limited to, a SSD. The memory devices 612-1, 612-2, 612-3, 612-4, 612-5, and 612-6 can be NAND memory devices. The processing device 615 can include or be structured as one or more types of processors compatible with the memory devices 612-1, 612-2, 612-3, 612-4, 612-5, and 612-6. The bus 627 can be an open NAND flash interface (ONFI) bus for the memory devices 612-1, 612-2, 612-3, 612-4, 612-5, and 612-6 being NAND flash memory devices. The buffer 614 can be or included in a RAM. Though buffer 614 is external to processing device 615 in memory system 610 in FIG. 6, the buffer 614 may be integrated into the processing device 615. The buffer 615 can be coupled to the bus 627 for communication with other components of the memory system 610. Alternatively, the buffer 614 can be coupled with processing device 615 in which the processing device 615 handles communications between the buffer 614 and other components of the memory system 610. The buffer 615 can be coupled to the bus 627 and to the processing device 615.

In various embodiments, the firmware 625 can have instructions, executable by the processing device 615, to operate on multiple memory devices of the memory devices 612-1, 612-2, 612-3, 612-4, 612-5, and 612-6, where each memory device includes an array of memory cells organized into one or more planes, and the multiple memory devices can be organized into multiple blocks, where each block has multiple pages with each page having a different portion of the page in a portion of each plane of the one or more planes of the multiple memory devices. The instructions can be executed to perform operations to program a page in a block of the multiple blocks by programming data in each portion of each plane of the one or more planes of the multiple memory devices mapped to the page; generate a parity for the data programmed in the page; and store the parity in the buffer 614, where the buffer 614 is configured to hold parity data. The operations include operations to transfer the parity data from the buffer 614 to a temporary block in response to a determination that a transfer criterion is satisfied; and conduct, after a closing of the block, a verification of the block with respect to data errors. The temporary block can be a block of the multiple blocks that is not part of the data storage.

FIG. 7 is an illustration of an embodiment of an example operation of a parity protection scheme in an arrangement of blocks of memory in multiple memory devices. This arrangement can be executed in the memory system 610 of FIG. 6. The firmware can include instructions to operate multiple memory devices of the memory devices 612-1, 612-2, 612-3, 612-4, 612-5, and 612-6 together by arranging super blocks from the array of memory cells of these blocks. The super block is operated as a block having a number of pages with each page having portions of the page spread over segments of the multiple memory devices. With the memory devices arranged as planes of memory cells, the segments of the multiple memory devices correspond to portions of the planes of the multiple memory devices. For example FIG. 7 illustrates a physical plane temporary SLC parity backup RAIN scheme. Formats other than SLC can be implemented in a similar manner.

Memory devices 612-1 and 612-2 can be NAND memory devices that are arranged as LUN 1 and LUN 2 with each LUN arranged as four planes: plane 0, plane 1, plane 2, and plane 3. Data for storage in a page can be spread out among these four planes and two memory devices. Since these pages include data spread out over one or more planes for two of more devices, these pages can be referred to as super pages of a super block. In this example, an arrangement 716 for a host super block, which can be referred to as data block 0 in this example, shows eight super pages: super page <0>, super page <1>, super page <2>, super page <3>, super page <4>, super page <5>, super page <6>, and super page <7>, where each super page includes a different portion of the super page in a portion of each plane of the LUN 1 and the LUN 2. The super block is referred to as a host super block sine it stores data originating from commands and data from a host, which can include a set of one or more processors. For example, super page <0> of the data block 0 has a portion of data D0 in the plane 0 of the LUN 1, a portion of the data D0 in the plane 1 of the LUN 1, a portion of the data D0 in the plane 2 of the LUN 1, a portion of the data D0 in the plane 3 of LUN 1, a portion of the data D0 in the plane 0 of the LUN 2, a portion of the data D0 in the plane 1 of the LUN 2, a portion of the data D0 in the plane 2 of the LUN 2, and a portion of the data D0 in the plane 3 of LUN 2. The super page <1> of the data block 0 has a portion of data D1 in the plane 0 of the LUN 1, a portion of the data D1 in the plane 1 of the LUN 1, a portion of the data D1 in the plane 2 of the LUN 1, a portion of the data D1 in the plane 3 of LUN 1, a portion of the data D1 in the plane 0 of the LUN 2, a portion of the data D1 in the plane 1 of the LUN 2, a portion of the data D1 in the plane 2 of the LUN 2, and a portion of the data D1 in the plane 3 of LUN 2. Additionally, data can be written into super page <1> . . . super page <7> in a similar manner by spreading portions of the data programmed a given super page being different among the planes of the LUN 1 and the planes of the LUN 2 to which the given super page is assigned. The host super block, referred to as data block 0 can include more super pages than the eight super pages shown in FIG. 7.

The parity of the data programmed into super page <0> of block 0 can be calculated and stored in a RAM buffer for RAIN parity, such as buffer 614 of memory system 610 of FIG. 6. The buffer 614 can store a mapping 717 of a super page <n> to the calculated parity for super page <n>. The mapping can be generated in a table format in buffer 614. The portions of data D0 in each of the portions of the plane 0 of the LUN 1, the portions of the plane 1 of the LUN 1, the portions of the plane 2 of the LUN 1, the portions of the plane 3 of the LUN 1, the portions of the plane 0 of the LUN 2, the portions of the plane 1 of the LUN 2, the portions of the plane 2 of the LUN 2, and the portions of the plane 3 of the LUN 2, which are assigned to super page <0>, are used to generate the parity. P0, for super page <0> of block 0. As shown in FIG. 7, mapping 717 can include the mapping of super page <0> to parity P0 for data D0 being written to data block 0, super page <1> to parity P1 for data D1 being written to data block 0, super page <2> to parity P2 for data D2 being written to data block 0, super page <3> to parity P3 for data D3 being written to data block 0, super page <4> to parity P4 for data D4 being written to data block 0, super page <5> to parity P5 for data D5 being written to data block 0, super page <6> to parity P6 for data D6 being written to data block 0, super page <7> to parity P7 for data D7 being written to data block 0. Each of the parities P0-P7 can be generated using XOR circuitry. In this example, the number of mappings in the buffer of the super page to its parity for the data it stores can be equal to the sum of the number of planes in LUN 1 and the number of planes in LUN 2. Other arrangements can be constructed.

In the arrangement 716 for the host super block, which is referred to as data block 0 in this example, firmware 635 of FIG. 6 can include instructions to generate RAIN parity for every super page <n> in the data block 0 and to store the RAIN parity in the corresponding locations in the RAIN parity buffer, such as buffer 614 of FIG. 6, that are available. Once the RAIN parity buffer is full, the parity data in the RAIN parity buffer can be dumped to a temporary parity super page in a temporary parity super block. This super block and this super page for parity are called temporary, since after data block 0 is determined to be acceptable to store the data written into it, the parity data for data block 0 can be released from this temporary parity super block and the temporary parity super pages in the temporary parity super block. Then, the temporary parity super block can be used again to receive parity data from the RAM buffer in response to other programming of data or the temporary parity super block can be released to the pool of blocks of the memory system, such as memory system 610, that are free to be allocated for used to store user data.

The size of buffer 614 in a RAM can be designed to use limited space for parity data. For example, buffer 614 can have entries for a number of pages defined by the product of the number of planes of each memory device and the number of memory devices in which the host super block defined. Other arrangements for buffer 614 may be constructed. At the completion of writing to super pages <0> . . . <7> and the generation of parity for each of the super pages <0> . . . <7>, the buffer 614 is filled with the generated parity data. Upon filling the buffer 614, the data is transferred to the temporary parity super block. Once the parity data is transferred to the temporary parity super block, parity data from writing new data to super pages <8>-<15> of the data block 0 can be stored in the entries of buffer 614 that previously held the parity data for super pages <0>-<157>. Upon filing the buffer 614 again, the parity data for super pages <8>-<15> can be transferred to the temporary priority super block, for example to temporary super page <1>, and buffer 614 is available for further new data written to data block 0.

In transferring the parity data from buffer 614, for example, to LUN 1 and LUN 2, each temporary super page of the temporary block holds in portions of the planes of LUN 1 and in portions of the planes of LUN 2 assigned to the temporary super page, parity data for each page of the data block 0. A temporary super page holds the parity data individually generated for each of the pages storing data in the block to which the page is assigned. The arrangement 718 illustrates the structure of a temporary parity super block and its temporary super pages. For example, for data in data block 0, the temporary super page <0> holds P0 from buffer 614 in a portion of plane 0 of LUN 1 of the temporary parity super block. The temporary super page <0> holds P1 from buffer 614 in a portion of plane 1 of LUN 1 of the temporary parity super block. The temporary super page <0> holds P2 from buffer 614 in a portion of plane 2 of LUN 1 of the temporary parity super block. The temporary super page <0> holds P3 from buffer 614 in a portion of plane 3 of LUN 1 of the temporary parity super block. The temporary super page <0> holds P4 from buffer 614 in a portion of plane 0 of LUN 2 of the temporary parity super block. The temporary super page <0> holds P5 from buffer 614 in a portion of plane 1 of LUN 2 of the temporary parity super block. The temporary super page <0> holds P6 from buffer 614 in a portion of plane 2 of LUN 2 of the temporary parity super block. The temporary super page <0> holds P7 from buffer 614 in a portion of plane 3 of LUN 2 of the temporary parity super block. The temporary super page <1> can hold similar parity data from buffer 614 after buffer 614 is filled with parity data from super pages <8>-<15>. This process can continue until all super pages of data block 0 are programmed with data, which closes data block 0.

After the data block 0 is closed, a scan of the data block 0 can be performed for verification of acceptable write operations to data block 0. If the scan on the data block 0 passes, the temporary parity super block can be released and used for the next data block write. Release of the temporary super block can be conducted in response to a determination that the verification yields no uncorrectable error-correcting code (ECC) errors or a count of correctable ECC errors is less than a threshold for correctable ECC errors. If the scan on the data block fails, then the parity data from the temporary parity block can be used to recover failing pages. After rebuilding the failed pages and relocating the failed pages to another block, the data block can be retired. Such a process can be conducted for other host super hosts of the multiple memory devices.

Figure 8:
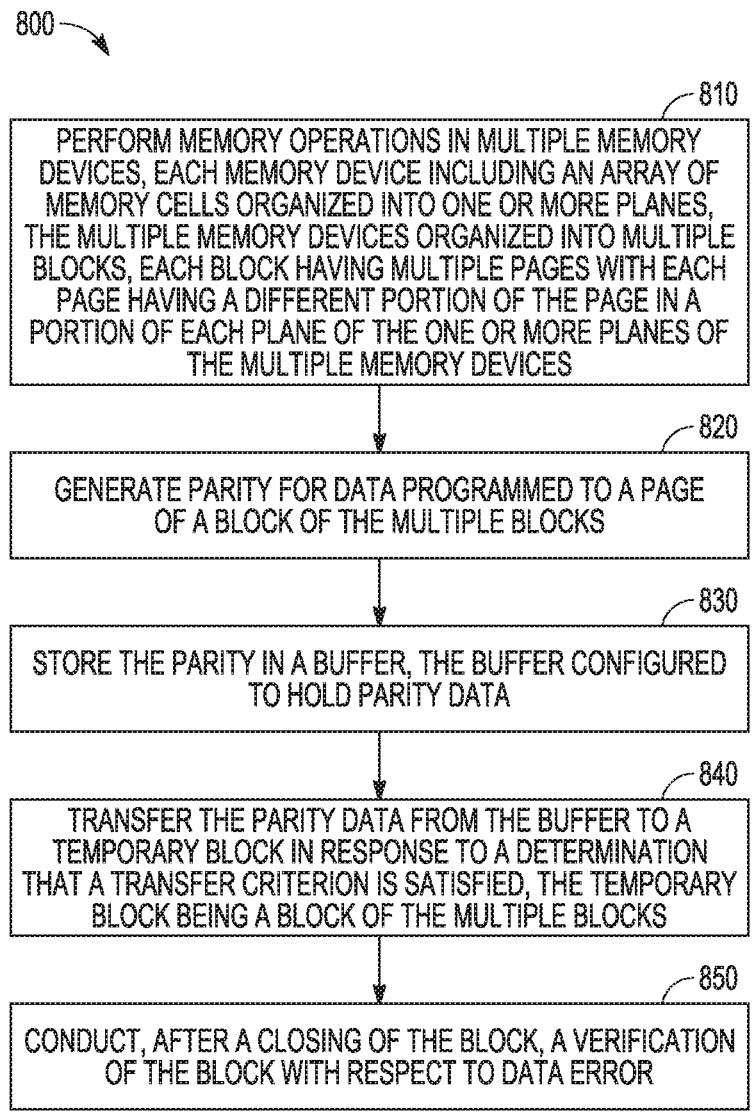
FIG. 8 is a flow diagram of features of an example method of providing parity protection to data in multiple memory devices, according to various embodiments.

FIG. 8 is a flow diagram of features of an embodiment of an example method 800 of providing parity protection to data in multiple memory devices. At 810, memory operations are performing in multiple memory devices. Each memory device of the multiple memory devices includes an array of memory cells organized into one or more planes and the multiple memory devices organized into multiple blocks. Each block of the multiple blocks has multiple pages with each page having a different portion of the page in a portion of each plane of the one or more planes of the multiple memory devices. At 820, parity is generated for data programmed to a page of a block of the multiple blocks. At 830, the parity is stored the parity in a buffer, where the buffer is configured to hold parity data.

At 840, the parity data is transferred from the buffer to a temporary block in response to a determination that a transfer criterion is satisfied, where the temporary block is a block of the multiple blocks. The transfer criterion can be a criterion that entries of the buffer that are allocated to hold parity data are full of parity data or that all pages of the block are filled. Transferring the parity data can include transferring the parity data to one or more pages in the temporary block and conducting the verification includes scanning the block.

At 850, after a closing of the block, a verification of the block with respect to data errors is conducted. Variations of the method 800 or methods similar to the method 800 can include a number of different embodiments that may be combined depending on the application of such methods and/or the architecture of systems in which such methods are implemented. Such methods can include releasing the temporary block from operating as a storage for the parity data in response to a determination that the verification yields no uncorrectable error-correcting code (ECC) errors or a count of correctable ECC errors is less than less than a threshold for correctable ECC errors. Releasing the block can include adding the block to a pool of blocks free for utilization to store data. The method 800 or methods similar to the method 800 can include receiving in the buffer new parity data generated from data newly written to the block, after transferring the parity data from the buffer to the temporary block and before closing the block.

Firmware can comprise instructions, such as a microcode, which, when executed by a processing device, can cause performance of operations comprising operations associated with multiple block having parity protection of data as associated with any of the FIGS. 1-7, the method 700, methods similar to the method 700, other methods, and associated device structures and data structures as taught herein. For example, firmware can comprise instructions, which, when executed by a processing device, can cause performance of operations, the operation comprising operations to: perform memory operations in multiple memory devices, each memory device including an array of memory cells organized into one or more planes, the multiple memory devices organized into multiple blocks, each block having multiple pages with each page having a different portion of the page in a portion of each plane of the one or more planes of the multiple memory devices; generate parity for data programmed to a page of a block of the multiple blocks; store the parity in a buffer, the buffer configured to hold parity data; transfer the parity data from the buffer to a temporary block in response to a determination that a transfer criterion is satisfied, the temporary block being a block of the multiple blocks; and conduct, after a closing of the block, a verification of the block with respect to data errors. The transfer criterion can be a criterion that entries of the buffer that are allocated to hold parity data are full of parity data or that all pages of the block are filled.

Instructions of the firmware can include instructions to release the temporary block from operating as a storage for the parity data in response to a determination that the verification yields no uncorrectable error-correcting code (ECC) errors or a count of correctable ECC errors is less than less than a threshold for correctable ECC errors. Instructions to release the block includes adding the temporary block to a pool of blocks free for utilization to store data.

Instructions of the firmware can include instructions to transfer the parity data by transfer of the parity data to one or more pages in the temporary block and to scan the block to conduct the verification. Such instructions can include operations to receive in the buffer new parity data generated from data newly written to the block, after transferring the parity data from the buffer to the temporary block and before closing the block.

In various embodiments, a system can comprise a processing device, multiple memory devices, a buffer, and firmware. Each of the multiple memory devices can include an array of memory cells organized into one or more planes. The multiple memory devices can be organized into multiple blocks, where each block has multiple pages with each page having a different portion of the page in a portion of each plane of the one or more planes of the multiple memory devices. The firmware can include stored instructions, executable by the processing device, to perform operations, where the operations including operations to program a page in a block of the multiple blocks by programming data in each portion of each plane of the one or more planes of the multiple memory devices mapped to the page. The operations can include operations to generate a parity for the data programmed in the page and store the parity in the buffer, where the buffer is configured to hold parity data. The operations can include operations to transfer the parity data from the buffer to a temporary block in response to a determination that a transfer criterion is satisfied, where the temporary block is a block of the multiple blocks, and operations to conduct, after a closing of the block, a verification of the block with respect to data errors. The transfer criterion can be a criterion that entries of the buffer that are allocated to hold parity data are full of parity data or that all pages of the block are filled.

Each block of the multiple blocks can be arranged with a number of planes in each memory device of the multiple memory devices, with the number being a positive integer in a range from and including two to and including six. The buffer can be a RAM configured to store a mapping of parity data for a number of pages of a number of blocks with parity for each page generated using data programmed into each plane of the multiple devices to which the page is assigned. The mapping can be realized in tabular form containing identifications of pages and the parity data for data in each identified page. The parity data for each page may have a size of 16 KB. The parity data size may be less or more than 16 KB. A page of the temporary block can be configured to store, in each portion of each plane of the one or more planes assigned to the page of the temporary block, parity generated from different pages of the block in which data is programmed. Operations, in response to firmware instructions executed by the processing device can include release of the temporary block in response to a determination that the verification yields no uncorrectable error-correcting code (ECC) errors or a count of correctable ECC errors is less than a threshold for correctable ECC errors. A count of the correctable ECC errors exceeding threshold for correctable ECC errors can be an indication that the block to which data is written is prone to defects.

Variations of such a system can include a number of different embodiments that may be combined depending on the implementation for which such systems are designed. Such systems can include transfer of the parity data to one or more pages in the temporary block and the verification of the block can include a scan of the block. Operations, in response to firmware instructions executed by the processing device can include, in response to the scan of the block having a pass condition, release of the temporary block by addition of the temporary block to a pool of memory blocks free for utilization to storage user data. Operations, in response to firmware instructions executed by the processing device can include, in response to the scan of the block having a pass condition, release of the temporary block for use as a temporary block in a next data block write operation. Operations, in response to firmware instructions executed by the processing device can include, in response to the scan of the data super block having a fail condition, use of parity data from the temporary block to recover failing pages. Operations to recover failing pages can include operations to relocate data in the block to another block in recovery of the failing pages and retire the block.

In various embodiments, a system can comprise a processing device, multiple memory devices, a RAM buffer, and firmware. The processing device can be arranged to couple to an external interface. The external interface can couple the processing device to a host. The system can include an internal interface to couple the multiple memory devices to the processing device. The RAM buffer can be coupled to the internal interface. The multiple memory devices may be realized by multiple NAND memory devices. Each memory device of the multiple memory devices can include an array of memory cells organized into one or more planes. The multiple memory devices can be organized into multiple blocks, where each block has multiple pages with each page having a different portion of the page in a portion of each plane of the one or more planes of the multiple memory devices. The firmware can have stored instructions, executable by the processing device, to perform operations on the multiple memory devices. The operations can include operations to program a page in a block of the multiple blocks by programming data in each portion of each plane of the one or more planes of the multiple memory devices mapped to the page. The operations can include operations to generate a parity for the data programmed in the page and store the parity in the random access memory buffer, where the RAM buffer is configured to hold parity data. The operations include operations to transfer the parity data from the RAM buffer to a temporary block in response to a determination that a transfer criterion is satisfied, where the temporary block is a block of the multiple blocks, and to conduct, after a closing of the block, a verification of the block with respect to data errors. The transfer criterion can be a criterion that entries of the buffer that are allocated to hold parity data are full of parity data or that all pages of the block are filled.

The RAM buffer can be configured to store a mapping of parity data for a number of pages of a number of blocks with parity for each page generated using data programmed into each plane of the multiple memory devices to which the page is assigned. A page of the temporary block can be configured to store, in each portion of each plane of the one or more planes assigned to the page of the temporary block, parity generated from different pages of the block in which data is programmed.

The following are example embodiments of systems and methods, in accordance with the teachings herein.

An example system 1 can comprise: a processing device; multiple memory devices, each memory device including an array of memory cells organized into one or more planes, the multiple memory devices organized into multiple blocks, each block having multiple pages with each page having a different portion of the page in a portion of each plane of the one or more planes of the multiple memory devices; a buffer; and firmware having stored instructions, executable by the processing device, to perform operations, the operations including operations to: program a page in a block of the multiple blocks by programming data in each portion of each plane of the one or more planes of the multiple memory devices mapped to the page; generate a parity for the data programmed in the page; store the parity in the buffer, the buffer configured to hold parity data; transfer the parity data from the buffer to a temporary block in response to a determination that a transfer criterion is satisfied, the temporary block being a block of the multiple blocks; and conduct, after a closing of the block, a verification of the block with respect to data errors.

An example system 2 can include features of example system 1 and can include the operations to include release of the temporary block in response to a determination that the verification yields no uncorrectable error-correcting code (ECC) errors or a count of correctable ECC errors is less than a threshold for correctable ECC errors.

An example system 3 can include features of any of the preceding example systems and can include the transfer criterion being a criterion that entries of the buffer that are allocated to hold parity data are full of parity data or that all pages of the block are filled.

An example system 4 can include features of any of the preceding example systems and can include the block being arranged with a number of planes in each memory device of the multiple memory devices, the number being a positive integer in a range from and including two to and including six.

An example system 5 can include features of any of the preceding example systems and can include transfer of the parity data being a transfer to one or more pages in the temporary block; and the verification of the block includes a scan of the block.

An example system 6 can include features of any of the preceding example systems and can include the operations to include, in response to the scan of the block having a pass condition, release of the temporary block by addition of the temporary block to a pool of memory blocks free for utilization.

An example system 7 can include features of any of the preceding example systems and can include the operations to include, in response to the scan of the block having a pass condition, release of the temporary block for use in a next data block write operation.

An example system 8 can include features of any of the preceding example systems and can include the operations to include, in response to the scan of the data super block having a fail condition, use of parity data from the temporary block to recover failing pages.

An example system 9 can include features of any of the preceding example systems and can include the operations to include operations to: relocate data in the block to another block in recovery of the failing pages; and retire the block.

An example system 10 can include features of any of the preceding example systems and can include the buffer being a random access memory configured to store a mapping of parity data for a number of pages of a number of blocks with parity for each page generated using data programmed into each plane of the multiple devices to which the page is assigned.

An example system 11 can include features of any of the preceding example systems and can include a page of the temporary block being configured to store, in each portion of each plane of the one or more planes assigned to the page of the temporary block, parity generated from different pages of the block in which data is programmed.

An example system 12 include features of any of the preceding example systems and can comprise: a processing device arranged to couple to an external interface; multiple memory devices, each memory device including an array of memory cells organized into one or more planes, the multiple memory devices organized into multiple blocks, each block having multiple pages with each page having a different portion of the page in a portion of each plane of the one or more planes of the multiple memory devices; a random access memory buffer; an internal interface to couple the multiple memory devices to the processing device, the random access memory buffer coupled to the internal interface; and firmware having stored instructions, executable by the processing device, to perform operations, the operations including operations to: program a page in a block of the multiple blocks by programming data in each portion of each plane of the one or more planes of the multiple memory devices mapped to the page; generate a parity for the data programmed in the page; store the parity in the random access memory buffer, the random access memory buffer configured to hold parity data; transfer the parity data from the random access memory buffer to a temporary block in response to a determination that a transfer criterion is satisfied, the temporary block being a block of the multiple blocks; and conduct, after a closing of the block, a verification of the block with respect to data errors.

An example system 13 can include features of any of the preceding example systems and can include the operations to include the transfer criterion being a criterion that entries of the buffer that are allocated to hold parity data are full of parity data or that all pages of the block are filled.

An example system 14 can include features of any of the preceding example systems and can include the random access memory buffer being configured to store a mapping of parity data for a number of pages of a number of blocks with parity for each page generated using data programmed into each plane of the multiple devices to which the page is assigned.

An example system 15 can include features of any of the preceding example systems and can include a page of the temporary block being configured to store, in each portion of each plane of the one or more planes assigned to the page of the temporary block, parity generated from different pages of the block in which data is programmed.

An example method 1 can comprise: performing memory operations in multiple memory devices, each memory device including an array of memory cells organized into one or more planes, the multiple memory devices organized into multiple blocks, each block having multiple pages with each page having a different portion of the page in a portion of each plane of the one or more planes of the multiple memory devices; generating parity for data programmed to a page of a block of the multiple blocks; storing the parity in a buffer, the buffer configured to hold parity data; transferring the parity data from the buffer to a temporary block in response to a determination that a transfer criterion is satisfied, the temporary block being a block of the multiple blocks; and conducting, after a closing of the block, a verification of the block with respect to data errors.

An example method 2 can include features of example method 1 and can include releasing the temporary block from operating as a storage for the parity data in response to a determination that the verification yields no uncorrectable error-correcting code (ECC) errors or a count of correctable ECC errors is less than less than a threshold for correctable ECC errors.

An example method 3 can include features of any of the preceding example methods and can include releasing the temporary block includes adding the block to a pool of blocks free for utilization to store data.

An example method 4 can include features of any of the preceding example methods and can include the transfer criterion bring a criterion that entries of the buffer that are allocated to hold parity data are full of parity data or that all pages of the block are filled.

An example method 5 can include features of any of the preceding example methods and can include transferring the parity data includes transferring the parity data to one or more pages in the temporary block; and conducting the verification includes scanning the block.

An example method 6 can include features of any of the preceding example methods and can include receiving in the buffer new parity data generated from data newly written to the block, after transferring the parity data from the buffer to the temporary block and before closing the block.

An example method 6 can include features of any of the preceding example methods and can include performing functions associated with any features of example systems 1-16.

In various examples, the components, controllers, processors, units, engines, or tables described herein can include, among other things, physical circuitry or firmware stored on a physical device. As used herein, "processor device" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming." and can include both writing to or erasing from the memory cell (e.g., the memory cell may be programmed to an erased state).

According to one or more embodiments, a memory controller (e.g., a processor device, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.).

According to one or more embodiments, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A system comprising:
a processing device;
a plurality of memory devices, each memory device comprising an array of memory cells organized into a plurality of blocks, and each block comprising a plurality of pages;
a buffer; and
firmware comprising stored instructions, executable by the processing device, to perform operations comprising:
programming non-parity data in a page in a first block of the plurality of blocks;
generating a parity for the non-parity data programmed in the page;
storing the parity in the buffer, the buffer being configured to hold parity data;
transferring the parity data from the buffer to a temporary block in response to a determination that a transfer criterion is satisfied, the temporary block comprising a second block of the plurality of blocks, and the temporary block operating as temporary storage for the parity data; and
conducting, after a closing of the first block, a verification of the first block with respect to data errors.

2. The system of claim 1, wherein the operations further comprise:
releasing of the temporary block from operating as temporary storage for the parity data in response to a determination that the verification yields no uncorrectable error-correcting code (ECC) errors or a count of correctable ECC errors is less than a threshold for correctable ECC errors.

3. The system of claim 1, wherein the transfer criterion is a criterion that entries of the buffer that are allocated to hold parity data are full of parity data or that all pages of the first block are filled.

4. The system of claim 1, wherein the first block is arranged with a number of planes in each memory device of the plurality of memory devices, the number being a positive integer in a range from and including two to and including six.

5. The system of claim 1, wherein the transferring the parity data from the buffer to the temporary block comprises transferring the parity data to one or more pages in the temporary block; and wherein the conducting the verification of the first block with respect to data errors comprises a scan of the first block.

6. The system of claim 5, wherein the operations further comprise:
in response to the scan of the first block having a pass condition, releasing of the temporary block from operating as temporary storage for the parity data by adding the temporary block to a pool of memory blocks, each block in the pool of memory blocks being free to be allocated for use to store new data.

7. The system of claim 5, wherein the operations further comprise:
in response to the scan of the first block having a pass condition, releasing of the temporary block from operating as temporary storage for the parity data, the temporary block being free for use in a next data block write operation of new data after the releasing.

8. The system of claim 5, wherein the operations further comprise:
in response to the scan of the first block having a fail condition, using the parity data from the temporary block to recover a set of failing pages of the first block.

9. The system of claim 8, wherein the operations further comprise:
relocating data in the first block to another block that comprises the set of failing pages recovered using the parity data; and
retiring the first block.

10. The system of claim 1, wherein the buffer comprises a random access memory configured to store a mapping of parity data for a set of pages of a set of blocks with parity for each page, the parity for each page being generated using data programmed into each plane of the plurality of memory devices to which the page is assigned.

11. A system comprising:
a processing device arranged to couple to an external interface;
a plurality of memory devices, each memory device comprising an array of memory cells organized into a plurality of blocks, and each block comprising a plurality of pages;
a buffer;
an internal interface to couple the plurality of memory devices to the processing device, the buffer coupled to the internal interface; and
firmware having stored instructions, executable by the processing device, to perform operations comprising:
programming non-parity data in a page in a first block of the plurality of blocks;
generating a parity for the non-parity data programmed in the page;
storing the parity in the buffer, the buffer being configured to hold parity data;
transferring the parity data from the buffer to a temporary block in response to a determination that a transfer criterion is satisfied, the temporary block being a second block of the plurality of blocks, and the temporary block operating as temporary storage for the parity data; and
conducting, after a closing of the first block, a verification of the first block with respect to data errors.

12. The system of claim 11, wherein the operations further comprise:
releasing of the temporary block from operating as temporary storage for the parity data in response to a determination that the verification yields no uncorrectable error-correcting code (ECC) errors or a count of correctable ECC errors is less than a threshold for correctable ECC errors.

13. The system of claim 11, wherein the transfer criterion is a criterion that entries of the buffer that are allocated to hold parity data are full of parity data or that all pages of the first block are filled.

14. The system of claim 11, wherein the buffer is configured to store a mapping of parity data for a set of pages of a set of blocks with parity for each page, the parity for each page being generated using data programmed into each plane of the plurality of memory devices to which the page is assigned.

15. A method comprising:
performing memory operations in a plurality of memory devices, the plurality of memory devices organized into a plurality of blocks, each block comprising a plurality of pages;
generating a parity for non-parity data programmed to a page in a first block of the plurality of blocks;
storing the parity in a buffer configured to hold parity data;
transferring the parity data from the buffer to a temporary block in response to a determination that a transfer criterion is satisfied, the temporary block being a second block of the plurality of blocks, and the temporary block operating as temporary storage for the parity data; and
conducting, after a closing of the first block, a verification of the first block with respect to data errors.

16. The method of claim 15, further comprising:
releasing the temporary block from operating as temporary storage for the parity data in response to a determination that the verification yields no uncorrectable error-correcting code (ECC) errors or a count of correctable ECC errors is less than less than a threshold for correctable ECC errors.

17. The method of claim 16, wherein the releasing the temporary block from operating as the temporary storage for the parity data comprises:
adding the first block to a pool of blocks, each block in the pool of memory blocks being free to be allocated for use to store new data.

18. The method of claim 15, wherein the transfer criterion is a criterion that entries of the buffer that are allocated to hold parity data are full of parity data or that all pages of the first block are filled.

19. The method of claim 15, wherein the transferring the parity data from the buffer to the temporary block comprises transferring the parity data to one or more pages in the temporary block; and wherein the conducting the verification of the first block with respect to data errors comprises a scan of the first block.

20. The method of claim 15, further comprising:
receiving, in the buffer, new parity generated from non-parity data newly written to the first block, after transferring the parity data from the buffer to the temporary block and before closing the first block.

* * * * *